United States Patent [19]
Agatstein et al.

[11] Patent Number: 5,621,245
[45] Date of Patent: Apr. 15, 1997

[54] APPARATUS FOR OPTIMIZING OPERATING PARAMETERS OF AN INTEGRATED CIRCUIT PACKAGE HAVING A VOLTAGE REGULATOR MOUNTED THEREON

[75] Inventors: Willy Agatstein, El Dorado Hills, Calif.; Mostafa Aghazadeh, Chandler; Chia-pin Chiu, Phoenix, both of Ariz.; Amar Ghori, El Dorado Hills; James R. Neal, Cameron Park, both of Calif.; Gregory Turturio, Chandler, Ariz.

[73] Assignee: Intel Corporation, Santa Clara, Calif.

[21] Appl. No.: 741,526

[22] Filed: Oct. 31, 1996

Related U.S. Application Data

[63] Continuation of Ser. No. 172,603, Dec. 21, 1993, abandoned.

[51] Int. Cl.$^6$ ............................................. H01L 23/34
[52] U.S. Cl. ............................ 257/723; 257/697; 257/706
[58] Field of Search ................................. 257/697, 706, 257/723, 724, 924; 361/690, 717, 718

[56] References Cited

U.S. PATENT DOCUMENTS

| | | | |
|---|---|---|---|
| 4,733,293 | 3/1988 | Gabuzda | 257/697 |
| 4,916,576 | 4/1990 | Herbert et al. | 361/393 |
| 5,289,337 | 2/1994 | Aghazadeh et al. | 361/718 |
| 5,444,298 | 8/1995 | Schutz | 257/691 |

Primary Examiner—Jerome Jackson, Jr.
Assistant Examiner—Nathan K. Kelley
Attorney, Agent, or Firm—Owen L. Lamb

[57] ABSTRACT

A very large scale integrated (VLSI) chip designed to operate at 3.3 volts is modified to be compatible with prior systems having a 5 volt voltage supply. A central processing unit (CPU) is fabricated at a center position on an integrated circuit chip that has an operating voltage of 3.3 volts. The chip is soldered into a pin grid array (PGA) package and a heat sink is attached on the PGA package above the CPU. A 5 volt-to-3.3 volt voltage regulator having a 5 volt input and a 3.3 volt output is placed at an edge of the PGA package. The 3.3 volt output of the voltage regulator is connected to the 3.3 volt operating voltage input of the chip. The VCC 5 V on board pins are connected to the 5 volt input of the voltage regulator and the 3.3 volt output of the voltage regulator is connected to the VCC pins of the chip. VSS ground on board pins are connected in common to both the ground terminal of the voltage regulator and the VSS pads of the chip. High performance capacitors are used to improve the transient response of the on-package voltage regulator. Dual voltage operation of the voltage regulated package is achieved by making the output of the voltage regulator available at the pins of the pin grid array (PGA) package.

20 Claims, 2 Drawing Sheets

APPARATUS FOR OPTIMIZING OPERATING PARAMETERS OF AN INTEGRATED CIRCUIT PACKAGE HAVING A VOLTAGE REGULATOR MOUNTED THEREON

This application is a continuation of application Ser. No. 08/172,603 filed Dec. 21, 1993, now abandoned.

CROSS-REFERENCE TO RELATED APPLICATION

U.S. Pat. No. 5,556,811 (a division of this application) granted to Agatstein, W. et al, on Sep. 17, 1996 for "Method of Optimizing Operating Parameters Of An Integrated Circuit Package Having A Voltage Regulator Mounted Thereon", assigned to Intel Corporation, the assignee of this application.

BACKGROUND OF THE INVENTION

1. Field of the Invention

The present invention is related to very large scale integrated circuit chips and more specifically to apparatus for optimizing the operating parameters of a voltage regulator mounted on the surface of a very large scale integrated circuit chip package.

2. Prior Art

A chip or die is a substrate on which active and passive components of an integrated circuit are fabricated. In order to plug into a socket on a printed circuit board, the chip is mounted in a pin grid array (PGA) ceramic package. In prior very large scale integrated circuit (VSLI) chips the supply voltage at which the components on the chip operate is 5 volts. Newer products designed to operate in low power personal computers operate at 3.3 volts. In order to allow a chip that is designed to 3.3 volt specification to operate in existing systems that operate with 5 volts, voltage regulators with a 5 volt to 3.3 volt conversion capability are mounted on the surface of the PGA package.

The response of a voltage regulator to changes in load is called the transient response, and the magnitude of the voltage deviations at the voltage regulator output is controlled in a particular application by the value of output capacitance selected. The output capacitor supplies current to load during the response and recovery time of the voltage regulator. On-package voltage regulation introduces unique requirements which must be met in the selection of the correct capacitors.

It is desirable to provide optimum values for capacitors to improve the transient response of an on-package voltage regulator.

It is desirable to permit new parts operating at 3.3 volts to operate in printed circuit boards with either 3.3 volt or 5 volt wiring.

It is desirable to provide dual voltage operation of a integrated circuit chip package having an on-package voltage regulator.

SUMMARY OF THE INVENTION

The invention provides an integrated circuit chip package comprising a pin grid array (PGA) package having a center portion and four edges. A central processing unit (CPU) is fabricated at a center position in the (PGA) package. The chip is electrically connected to the pin grid array (PGA) package. A heat dissipating heat sink for dissipating heat from the CPU is located above the CPU on the PGA package. A voltage regulator is provided for transforming a first voltage into an output voltage, the voltage regulator being centered at one edge of the four edges of the PGA package. A vertical connection in the package, known as a via, connects the output voltage of the voltage regulator by way of standard package interconnects to the operating voltage input of the chip.

In accordance with an aspect of the invention, dual voltage operation is achieved by providing a vertical connection that connects the output voltage of the voltage regulator to a pin of the PGA package.

In accordance with a further aspect of the invention, transient response of the on-package voltage regulator is optimized by mounting, in parallel, multi-layer ceramic chip capacitors with an equivalent series resistance (ESR) and an equivalent series inductance (ESL) with in a specified critical range of values.

The invention has the advantage that the device becomes operable in systems which supply either the voltage regulator input pins, enabling the voltage regulator, or in systems which supply the correct regulated voltage directly, bypassing or disabling the voltage regulator. The device operates in a system designed to supply 5 V to the voltage regulator input pins, which is then regulated to 3.3 V and routed to the chip. Alternatively, the device operates in a system designed to supply 3.3 V directly to the voltage regulator output pins, which disables the voltage regulator.

The invention has further advantage that the device may be burned-in at the appropriate process voltage without the voltage regulator operating simply by driving the correct voltage onto the voltage regulator output pins.

The invention has further advantage that the device may be tested before the voltage regulator is mounted to the package resulting in a manufacturing cost saving since the cost of the surface mounted components is saved from all units which fail due to assembly or burn-in process fallout.

The foregoing and other features and advantages of the invention will be apparent from the following more particular description of a preferred embodiment of the invention as illustrated in the accompanying drawings.

DESCRIPTION OF THE PREFERRED EMBODIMENT

Figure 1:
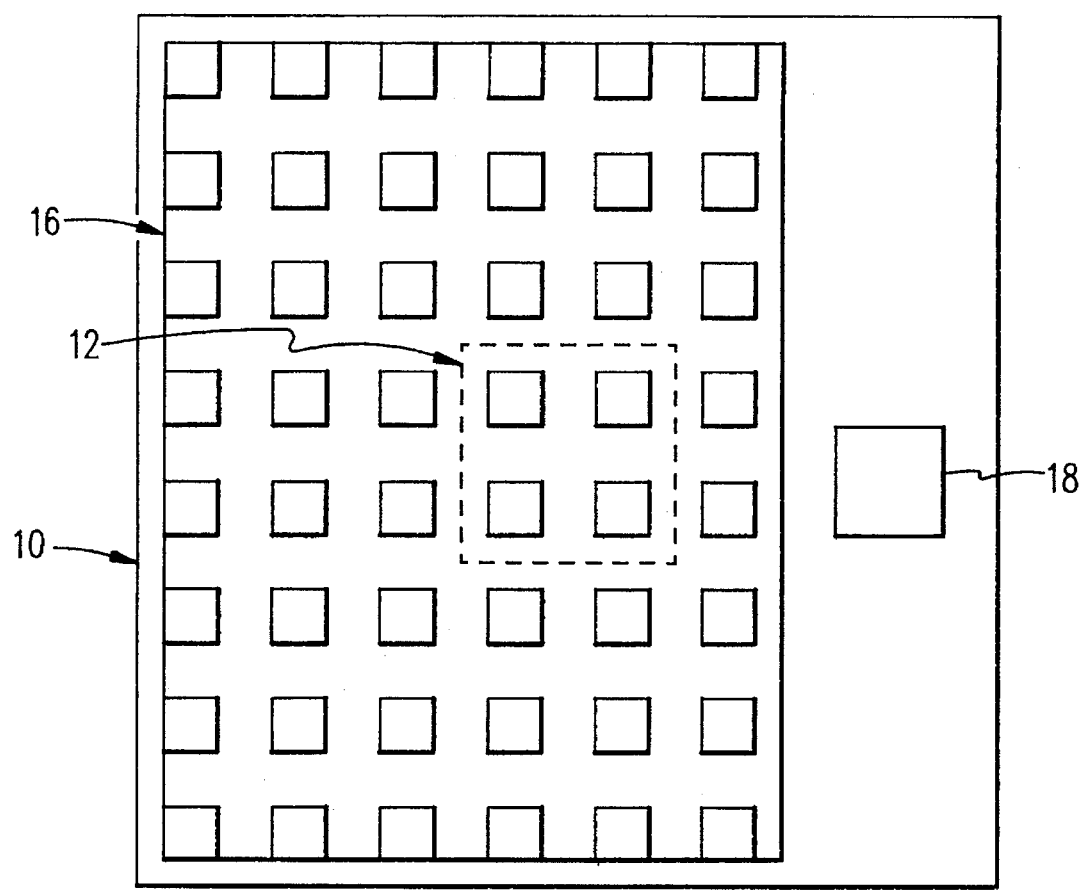
FIG. 1 is a diagram of a pin grid array (PGA) package to which the voltage regulator is mounted.
Figure 2:
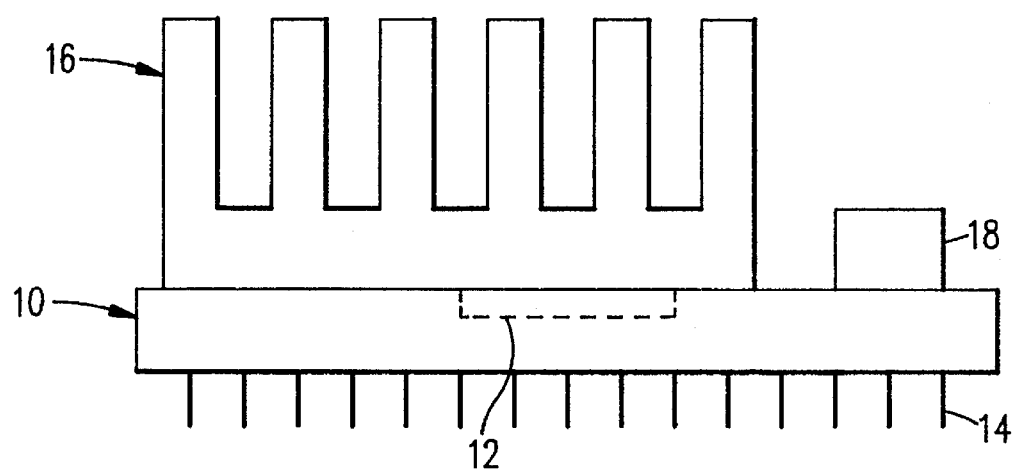
FIG. 2 is a diagram in cross-section of the PGA package shown in FIG. 1.

Refer to FIG. 1 which is a diagram of an integrated circuit chip apparatus constructed in accordance with the teachings of the present invention. The apparatus includes a pin grid array (PGA) package (10) and an integrated circuit chip (12) soldered into the array. The chip (12) has a 3.3 volt operating voltage input (14) and a central processing unit fabricated at a center position on the package. The integrated circuit chip is electrically connected to the pin grid array (PGA) package. A heat sink (16) for dissipating heat from the chip, is located above the chip on the PGA package. A voltage regulator (18) for transforming a 5 v input voltage into a 3.3 v output voltage, is centered at an edge of the package. A connector connects the output voltage of the voltage regulator to the operating voltage input of the chip.

The VCC pins of the PGA are connected to the input of the voltage regulator (18) and the output of the voltage regulator is connected to the VCC pads of the chip. VSS pins of the PGA are connected in common to both the ground (GND) terminal of the voltage regulator and the VSS pads of the chip.

Optimizing the Position of On-package Voltage Regulators

The location of a voltage regulator has a significant impact on the package thermal performance. If both voltage regulator and the CPU are located near the center of the package, the heat generated by the CPU is difficult to transfer through the voltage regulator to the heat sink. In addition, this kind of configuration results in a high power density near the package center, resulting in a hot spot. By moving the voltage regulator to the center of the package edge, the heat generated by the CPU can be transferred to the heat sink without going through the voltage regulator. By moving the voltage regulator to the center of the package edge the thermal resistance for the CPU is reduced and the corresponding chip temperature decreases, resulting in a higher allowable power limit. In addition, the base height of the heat sink can be reduced without the restriction of the voltage regulator and the fin height can be increased to enhance the heat transfer of the whole package.

Optimizing Transient Response

Voltage regulator data sheet specifications generally describe the performance of the regulator with a static load. The response of the regulator to changes in load is called the transient response, and the magnitude of the voltage deviations at the output is controlled in a particular application by the value of output capacitance selected. The output capacitor supplies current to load during the response and recovery time of the voltage regulator.

On-package voltage regulation introduces unique requirements which must be met in the selection of the correct capacitors. High performance capacitors correctly chosen improve the transient response of on-package voltage regulators. The following items must be considered:

1. The parasitic equivalent series inductance (ESL) and parasitic equivalent series resistance (ESR) must be managed to keep switching noise at a minimum.
2. There is a trade-off between the amount of space allocated for capacitors and space allocated for heat sink contact on the package surface.
3. The capacitors must have reasonably stable capacitance over the operating temperature range.
4. The capacitors must have reasonable high frequency performance.
5. The capacitors must be reliable over the product life-time.

Figure 3:
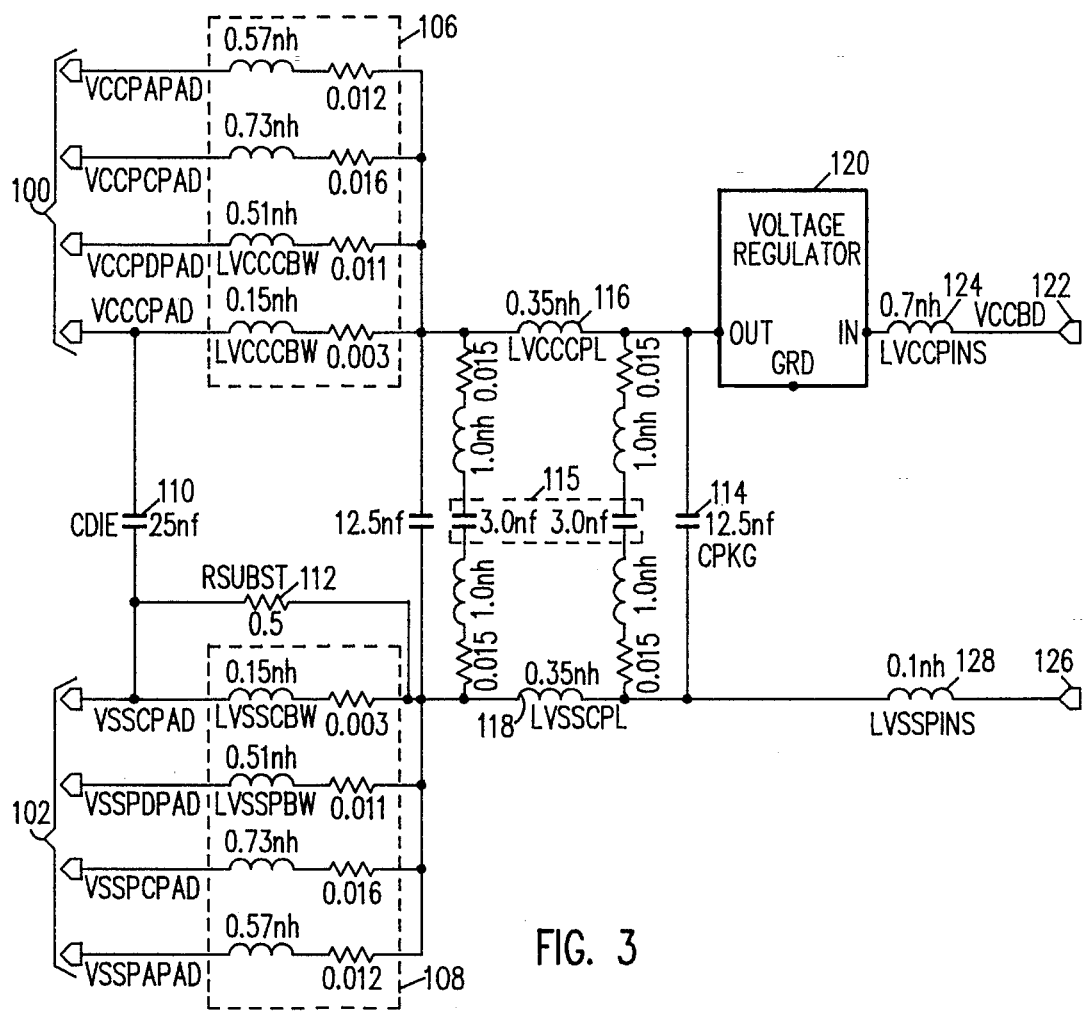
FIG. 3 is a schematic wiring diagram of the PGA package shown in FIG. 1.

To meet these requirements, multi-layer ceramic chip capacitors with X7R dielectric are used. These capacitors have an ESR 0.030 Ohm at 100 khz, and an ESL of 1.3 nh. The package is laid out for multiple capacitors in parallel to reduce these parasitic values still further. To keep noise at an acceptable level, no greater than 1.0 nh of inductance can be tolerated, which excludes the use of tantalum or electrolytic capacitors. FIG. 3 is a schematic representation of the package routing, including the parasitic parameters of the capacitors.

Once the low inductance requirement is met by the application of ceramic capacitors, the appropriate dielectric material must be selected. To achieve stable voltage regulation over the application temperature range, at least 6 uF of capacitance is required. The X7R dielectric capacitors were selected over other monolithic ceramics because of the relatively flat capacitance over the temperature range of 0° to 125° C., while simultaneously meeting the frequency, space, and reliability requirements.

In summary, for optimum performance the capacitor values should be in the following ranges:

Parasitic equivalent series inductance (ESL) of between 0.1 nano henry and 2.0 nano henry.

Parasitic equivalent series resistance (ESR): of between 10 milli Ohm and 100 milli Ohm at 100 khz.

The selection of the high performance capacitors require that the voltage regulator compensation circuitry be adjusted for maximum performance.

Refer to FIG. 3 which is a schematic wiring diagram of the PGA package shown in FIG. 1. FIG. 3 illustrates the CPU die, package, capacitors and the voltage regulator system. Vcc refers to an electrical supply voltage and Vss refers to an electrical ground. Vcc Tags (100) connect to Vcc power supply bond pads of a CPU die. Vss Tags (102) connect to Vss power supply bond pads of the CPU die. The inductors (106) and resistors (108) represent the inductance and resistance of the bond wires in parallel. The CDIE capacitor (110) represents the on-die capacitance. The Rsubst resistor (112) represents the resistance of the substrate Vss (ground) connections. The CPKG capacitor (114) represents the capacitance built into the thin tape layers of the PGA package. The 3.0 uF capacitors (115) represent the capacitance of capacitors mounted on the package surface. Each capacitor represents one-half of the total, split apart to account for the parasitic inductance (LVCCCPL-116 and LVSSCPL-118) of the planes. A voltage regulator (120) is mounted on the package surface and the input of the voltage regulator is connected to the VCCBD pin (122). The LVCCPINS inductor (124) represents the parallel inductance of the VCC pins and traces. The LVSSPINS inductor (128) represents the parallel inductance of the VSS pins and traces.

Dual Voltage Operation

Dual voltage operation of a voltage regulated package is achieved by making the regulated voltage output of the voltage regulator available at the pins of the pin grid array (PGA) package.

The advantage is that the device becomes operable in systems which supply either the voltage regulator input pins, enabling the voltage regulator, or in systems which supply the correct regulated voltage directly, bypassing or disabling the voltage regulator. The device operates in a system designed to supply 5 V to the voltage regulator input pins, which is then regulated to provide a 3.3 V regulated voltage output which is routed to the chip. Alternatively, the device operates in a system designed to supply 3.3 V directly to the voltage regulator output pins, which disables the voltage regulator. The 3.3 V pins of the PGA package are no-connects on a 5 V socket of a printed circuit board and the 5 V pins of the PGA package are no-connects on a 3.3 V socket of a printed circuit board.

The device may be burned-in (an infant mortality stress) at the appropriate process voltage without the voltage regulator operating simply by driving the correct voltage onto the voltage regulator output pins as described in item 1. above. This is an important feature because if the voltage regulator is not bypassed, the correct voltage acceleration factor is not achieved. There is also a manufacturing cost reduction potential since devices can be burned-in before the manufacturing step of mounting of the voltage regulator on the package.

The device may be tested before the voltage regulator is mounted to the package. This is another potential manufacturing cost saving since the cost of the surface mounted components would be saved from all units which fail due to assembly or burn-in process fallout.

Figure 4:
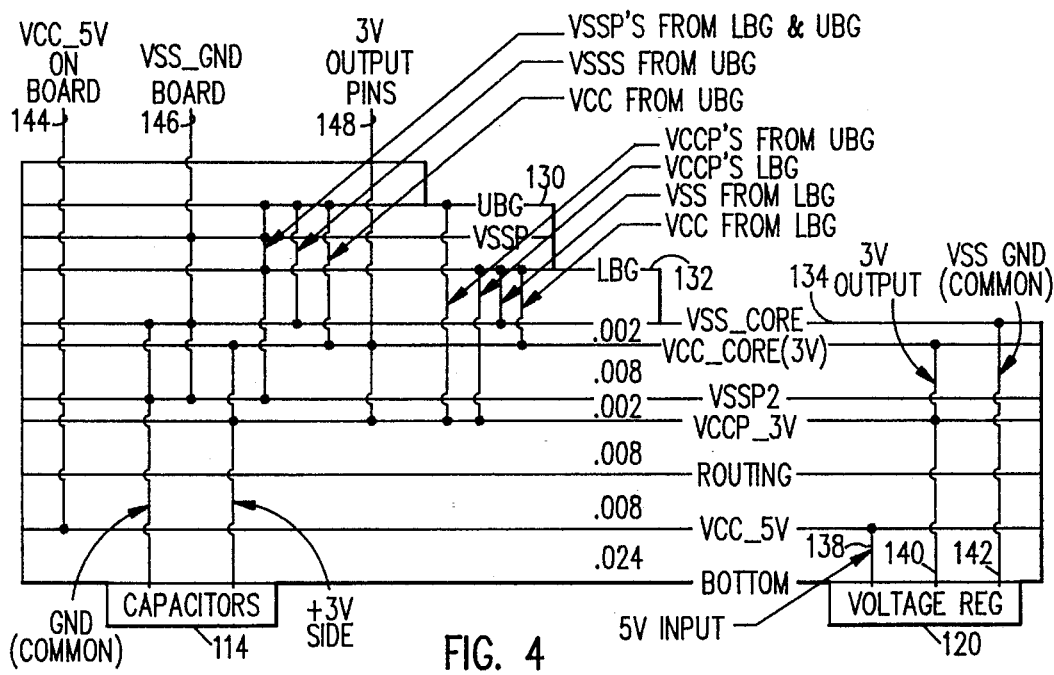
FIG. 4 is a representation of the layers in the PGA package shown in FIG. 1.

Refer to FIG. 4 which is a cross-sectional detail of the electrical connections between layers, components, pins, and the dual voltage connections of the PGA package shown in FIG. 1. Planes are depicted as horizontal lines and connections to a plane are depicted by a circle. The UBG upper bonding ground (130) and LBG lower bonding ground (132) is where the bond wires are connected. The backside of the CPU die attaches to the VSS_CORE plane (134). The braze plane (136) is where the cavity lid is soldered in place.

The voltage regulator 3.3 v output is connected to the VCCP_3 V plane and to the VCC_CORE(3 V) plane. The VCCP 3 V plane and the VCC_CORE(3 V) plane are also connected to the 3 v output pins (148) on the PGA package.

The voltage regulator 5 v input is connected to the VCC_5 V plane. The VCC_5 V plane is also connected to the VCC_5 V (144) pins on the PGA package. Bringing the VCC_5 V plane out to the board in addition to bringing the VCCP_3 V plane and the VCC_CORE(3 V) plane out to the 3 v output pins (148) permits new parts operating at 3 volts to operate in printed circuit boards with either 3 volt or 5 volt wiring. This provides dual voltage operation of a integrated circuit chip package having an on-package voltage regulator.

The VSS Gnd (142) of the voltage regulator is connected to the VSS_CORE ground plane (134). The VSS_CORE ground plane (134) is also connected to the VSS_Gnd (146) pins on the PGA package.

The capacitors (114) are connected to the VCCP_3 V plane and the VCC_CORE(3 V) plane.

While the invention has been particularly shown and described with reference to preferred embodiments thereof, it will be understood by those skilled in the art that the foregoing and other changes in form and detail may be made therein without departing from the scope of the invention.

What is claimed is:

1. An integrated circuit chip package comprising:

an integrated circuit chip;

said chip having an operating voltage input;

first means for electrically connecting said chip to a portion of said package;

second means for transforming a first voltage into a regulated voltage out;

said second means being located between said portion and one edge of said package;

third means for connecting said regulated voltage output to said operating voltage input of said chip; and, fourth means for connecting said regulated voltage output to a pin of said package.

2. The integrated circuit chip package of claim 1 further comprising:

fifth connection means for connecting to said regulated voltage output, in parallel, multi-layer ceramic chip capacitors with an equivalent series resistance (ESR) in the range of between 10 milli Ohms and 100 milli Ohms at 100 khz, and an equivalent series inductance (ESL) in the range of between 0.1 nano henry and 2.0 nano henry.

3. The integrated circuit chip package of claim 1 wherein said package is a pin grid array (PGA) package.

4. The integrated circuit chip package of claim 3 further comprising:

heat dissipating means for dissipating heat from said chip, said heat dissipating means being located above said chip on said pin grid array (PGA) package.

5. The integrated circuit chip package in accordance with claim 4 further comprising:

third connection means for connecting said regulated voltage output, in parallel, with multi-layer ceramic chip capacitors with an equivalent series resistance (ESR) in the range of between 10 milli Ohms and 100 milli Ohms at 100 khz, and an equivalent series inductance (ESL) in the range of between 0.1 nano henry and 2.0 nano henry.

6. The integrated circuit chip package of claim 3 wherein:

said pin grid array (PGA) package has a center portion and four edges;

said chip is connected to said center portion of said pin grid array (PGA) package; and, said voltage regulator means is located between said center portion and one edge of said four edges of said pin grid array (PGA) package.

7. The integrated circuit chip package in accordance with claim 6 further comprising:

third connection means for connecting said regulated voltage output, in parallel, with multi-layer ceramic chip capacitors with an equivalent series resistance (ESR) in the range of between 10 milli Ohms and 100 milli Ohms at 100 khz, and an equivalent series inductance (ESL) in the range of between 0.1 nano henry and 2.0 nano henry.

8. The integrated circuit chip package of claim 1 wherein:

said package has a center portion and four edges;

said chip is connected to said center portion of said package; and, said voltage regulator means is located between said center portion and one edge of said four edges of said package.

9. The integrated circuit chip package in accordance with claim 8 further comprising:

third connection means for connecting said regulated voltage output, in parallel, with multi-layer ceramic chip capacitors with an equivalent series resistance (ESR) in the range of between 10 milli Ohms and 100 milli Ohms at 100 khz, and an equivalent series inductance (ESL) in the range of between 0.1 nano henry and 2.0 nano henry.

10. The integrated circuit chip package of claim 9 further comprising:

heat dissipating means for dissipating heat from said chip, said heat dissipating means being located above said chip on said package.

11. An integrated circuit chip package comprising:

an integrated circuit chip located at a portion of said package;

said chip having an operating voltage input;

a voltage regulator located between said portion and one edge of said package;

said voltage regulator having a regulated voltage output;

a first electrical connection between said regulated voltage output and said operating voltage input of said chip; and, a second electrical connection between said regulated voltage output and a pin of said package.

12. The integrated circuit chip package of claim 11 further comprising:

a number of multi-layer ceramic chip capacitors with an equivalent series resistance (ESR) in the range of between 10 milli Ohms and 100 milli Ohms at 100 khz, and an equivalent series inductance (ESL) in the range of between 0.1 nano henry and 2.0 nano henry; and, a third electrical connection between said regulated voltage output and said number of multi-layer ceramic chip capacitors.

13. The integrated circuit chip package of claim 11 wherein said package is a pin grid array (PGA) package.

14. The integrated circuit chip package of claim 13 further comprising:

a heat sink located above said chip on said pin grid array (PGA) package.

15. The integrated circuit chip package in accordance with claim 14 further comprising:

a number of multi-layer ceramic chip capacitors with an equivalent series resistance (ESR) in the range of between 10 milli Ohms and 100 milli Ohms at 100 khz, and an equivalent series inductance (ESL) in the range of between 0.1 nano henry and 2.0 nano henry; and, a third electrical connection between said regulated voltage output and said number of multi-layer ceramic chip capacitors.

16. The integrated circuit chip package of claim 13 wherein:

said pin grid array (PGA) package has a center portion and four edges;

said chip is located at said center portion of said pin grid array (PGA) package; and, said voltage regulator is located between said center portion and one edge of said four edges of said pin grid array (PGA) package.

17. The integrated circuit chip package of claim 16 further comprising:

a number of multi-layer ceramic chip capacitors with an equivalent series resistance (ESR) in the range of between 10 milli Ohms and 100 milli Ohms at 100 khz, and an equivalent series inductance (ESL) in the range of between 0.1 nano henry and 2.0 nano henry; and, a third electrical connection between said regulated voltage output and said number of multi-layer ceramic chip capacitors.

18. The integrated circuit chip package of claim 11 wherein:

said package has a center portion and four edges;

said chip is located at said center portion of said package; and, said voltage regulator is located between said center portion and one edge of said four edges of said package.

19. The integrated circuit chip package of claim 18 further comprising:

a number of multi-layer ceramic chip capacitors with an equivalent series resistance (ESR) in the range of between 10 milli Ohms and 100 milli Ohms at 100 khz, and an equivalent series inductance (ESL) in the range of between 0.1 nano henry and 2.0 nano henry; and, a third electrical connection between said regulated voltage output and said number of multi-layer ceramic chip capacitors.

20. The integrated circuit chip package of claim 19 further comprising:

a heat sink located above said chip on said package.

\* \* \* \* \*

UNITED STATES PATENT AND TRADEMARK OFFICE
CERTIFICATE OF CORRECTION

PATENT NO. : 5,621,245

DATED : April 15, 1997

INVENTOR(S): Agatstein, et al.

It is certified that error appears in the above-identified patent and that said Letters Patent is hereby corrected as shown below:

Column 5, line 47, change "out" to -- output --..

Signed and Sealed this

Eighth Day of July, 1997

Attest:

BRUCE LEHMAN

Attesting Officer

Commissioner of Patents and Trademarks